United States Patent
Jung et al.

(10) Patent No.: US 7,607,055 B2
(45) Date of Patent: Oct. 20, 2009

(54) SEMICONDUCTOR MEMORY DEVICE AND METHOD OF TESTING THE SAME

(75) Inventors: Dae-Hee Jung, Gyeonggi-do (KR); Chul-Woo Park, Gyeonggi-do (KR); Seung-Young Seo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 305 days.

(21) Appl. No.: 11/349,286

(22) Filed: Feb. 6, 2006

(65) Prior Publication Data
US 2006/0195742 A1    Aug. 31, 2006

(30) Foreign Application Priority Data
Feb. 11, 2005    (KR) ...................... 10-2005-0011525

(51) Int. Cl.
*G11C 29/00*    (2006.01)
*G01R 31/28*    (2006.01)
*G06F 11/00*    (2006.01)

(52) U.S. Cl. ................ 714/719; 714/718; 714/724; 714/733; 714/738; 365/200; 365/201

(58) Field of Classification Search ................ None
See application file for complete search history.

(56) References Cited

U.S. PATENT DOCUMENTS

| | | | | |
|---|---|---|---|---|
| 5,925,142 A | * | 7/1999 | Raad et al. | 714/719 |
| 5,946,246 A | * | 8/1999 | Jun et al. | 365/201 |
| 6,195,771 B1 | * | 2/2001 | Tanabe et al. | 714/718 |
| 6,496,058 B1 | * | 12/2002 | Hong | 327/565 |
| 7,197,676 B2 | * | 3/2007 | Co et al. | 714/718 |
| 7,216,278 B2 | * | 5/2007 | Andreev et al. | 714/733 |
| 2003/0070126 A1 | * | 4/2003 | Werner et al. | 714/715 |
| 2006/0282722 A1 | * | 12/2006 | Co et al. | 714/724 |

FOREIGN PATENT DOCUMENTS

| | | |
|---|---|---|
| JP | 08-329698 | 12/1996 |
| JP | 2004-093421 | 3/2004 |
| KR | 1999-69337 | 9/1999 |

OTHER PUBLICATIONS

English language abstract of Korean Publication No. 1999-69337.
English language abstract of Japanese Publication No. 08-329698.
English language abstract of Japanese Publication No. 2004-093421.

* cited by examiner

*Primary Examiner*—Kevin L Ellis
*Assistant Examiner*—Daniel F McMahon
(74) *Attorney, Agent, or Firm*—Marger Johnson & McCollom, P.C.

(57) ABSTRACT

A semiconductor memory device includes at least one first built in self test (BIST) circuit configured to generate test pattern data, and at least one second BIST circuit configured to receive the test pattern data as received test pattern data and compare the received test pattern data to the test pattern data.

17 Claims, 5 Drawing Sheets

SEMICONDUCTOR MEMORY DEVICE AND METHOD OF TESTING THE SAME

CLAIM FOR PRIORITY

This application claims priority to Korean Patent Application No. 10-2005-0011525 filed on Feb. 11, 2005 in the Korean Intellectual Property Office, the entire contents of which are herein incorporated by reference.

BACKGROUND OF THE INVENTION

1. Field of the Invention

This disclosure relates to a method of testing of a semiconductor memory device, and more particularly to a method of testing a semiconductor memory device using a built-in self-test (BIST) circuit and a semiconductor memory device having a BIST circuit.

2. Description of the Related Art

In a conventional method of testing a memory device, data read from a memory array are output to a data output buffer, the output data are provided to an external memory test device through a data output pad, and then, the external memory test device performs a memory test operation using the output data.

When performing the memory test using the external memory test device having an operating frequency lower than that of the semiconductor memory device, a relatively long time is required for the memory test.

When performing the memory test using the external memory test device having the operating frequency identical with that of the semiconductor memory device, a high cost is incurred.

SUMMARY OF THE INVENTION

An embodiment includes a semiconductor memory device including at least one first built in self test (BIST) circuit configured to generate test pattern data, and at least one second BIST circuit configured to receive the test pattern data as received test pattern data and compare the received test pattern data to the test pattern data.

Another embodiment includes a built in self test (BIST) circuit for a semiconductor memory device including an output buffer, a pattern generator configured to generate a test pattern, a mode selector configured to select the test pattern and provide the test pattern to the output buffer, and a comparator configured to compare the test pattern with a received test pattern.

A further embodiment includes a method of testing a semiconductor memory device including generating a test pattern data in the semiconductor memory device, outputting the test pattern data from the semiconductor memory device, receiving the test pattern data in the semiconductor memory device, and comparing the test pattern data with the received test pattern data.

BRIEF DESCRIPTION OF THE DRAWINGS

The above and other features and advantages of the invention will become more apparent when embodiments are described in detailed with reference to the attached drawings in which.

DESCRIPTION OF THE EMBODIMENTS

Embodiments are disclosed herein. However, specific structural and functional details disclosed herein are merely representative for purposes of describing example embodiments. This invention may, however, be embodied in many alternate forms and should not be construed as limited to the embodiments set forth herein.

Accordingly, while other embodiments are susceptible to various modifications and alternative forms, specific embodiments are shown by way of example in the drawings and will be described in detail. It should be understood, however, that there is no intent to limit the invention to the particular forms disclosed, but, on the contrary, the invention is to cover all modifications, equivalents, and alternatives falling within the spirit and scope of the invention. Like numbers refer to like elements throughout the description of the figures.

It will be understood that, although the terms first, second, etc. may be used to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g. "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
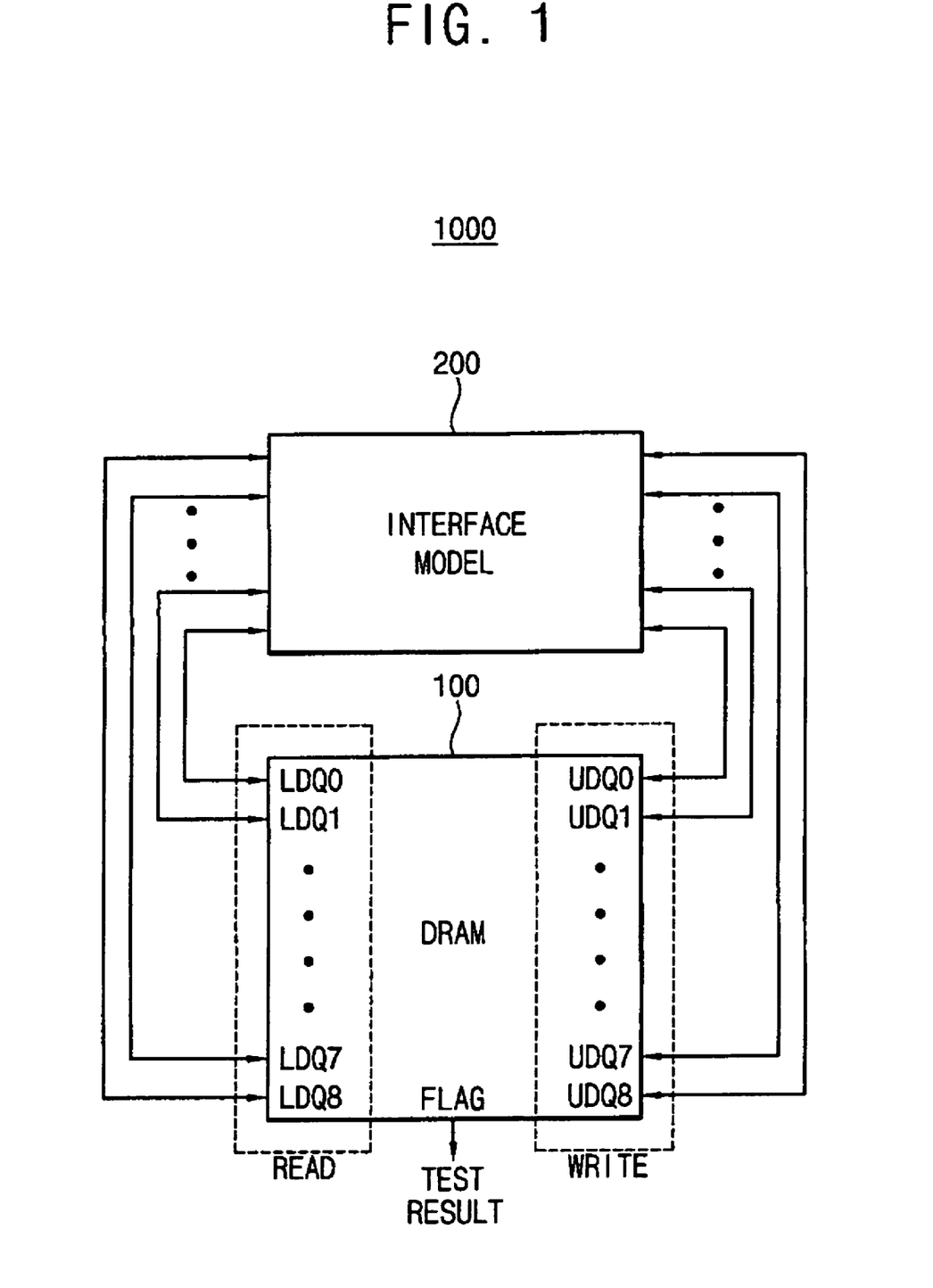
FIG. 1 is a block diagram illustrating a memory test system according to an embodiment.
Figure 2:
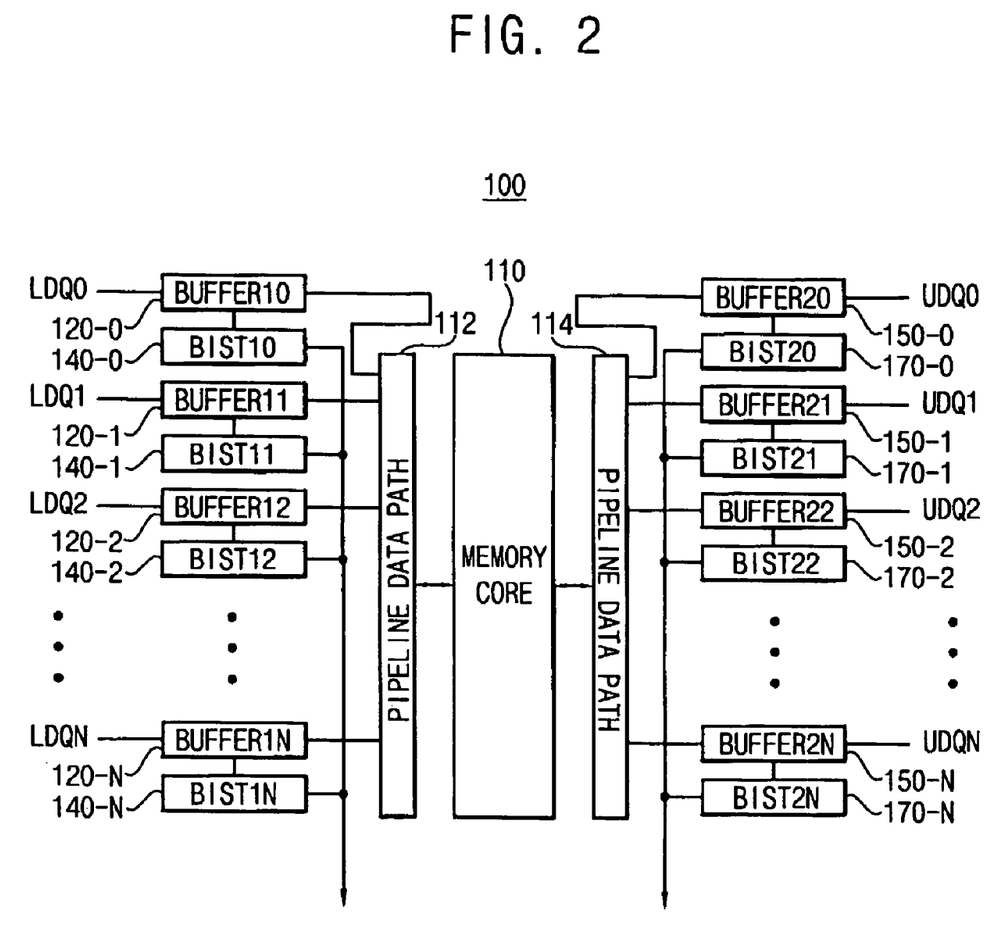
FIG. 2 is a block diagram illustrating a memory device including a built-in self-test (BIST) circuit according to an embodiment.

FIG. 1 is a block diagram illustrating a memory test system according to an embodiment, and FIG. 2 is a block diagram illustrating a memory device including a built-in self-test (BIST) circuit according to an embodiment. Referring to FIG. 1, the memory test system 1000 includes a host 200 and a memory device 100.

The host 200 receives test pattern data output from the memory device 100 and outputs the test pattern data to the memory device 100. The host 200 may be an interface model, for example, a central processing unit (CPU) or a motherboard.

Referring to FIG. 2, the memory device 100 includes a memory core 110, a first pipeline data path 112, a first buffer circuit 120-0 through 120-N coupled to a first data input/output pin LDQ0 through LDQN, a first BIST circuit 140-0 through 140-N, a second pipeline data path 114, a second buffer circuit 150-1 through 150-N coupled to a second data input/output pin UDQ0 through UDQN and a second BIST circuit 170-0 through 170-N.

The data read from the memory core 110 including the memory cell array (not shown) or the test pattern data output from the first BIST circuit 140-0 through 140-N included in the memory device 100 are transferred to the host 200 via the first buffer circuit 120-0 through 120-N and the first data input/output pin LDQ0 through LDQN. The data output from the host 200 are input to the second data input/output pin UDQ0 through UDQN to be written to the memory cell array (not shown) included in the memory core 110 via the second buffer circuit 150-0 through 150-N. The test pattern data output from the host 200 are input to the second data input/output pin UDQ0 through UDQN to be provided to the second BIST circuit 170-0 through 170-N via the second buffer circuit 150-0 through 150-N.

In alternative embodiments, the data read from the memory core 110 including the memory cell array (not shown) or the test pattern data output from the second BIST circuit 170-0 through 170-N may be transferred to the host 200 via the second buffer circuit 150-0 through 150-N via the second data input/output pin UDQ0 through UDQN.

Additionally, in alternative embodiments, the data output from the host 200 may be input through the first data input/output pin LDQ0 through LDQN to be written to the memory cell array (not shown) included in the memory core 110 via the first buffer circuit 120-0 through 120-N, or the test pattern data output from the host 200 may be input through the first data input/output pin LDQ0 through UDQN to be provided to the first BIST circuit 140-0 through 140-N via the first buffer circuit 120-0 through 120-N.

The number of the first or second data input/output pins shown in FIG. 1 is 8. As a result, the first/second data input/output pins shown in FIG. 1 are a type X16, and the total number of the data input/output pins is 16. In other embodiments, a type X8, a type X36 or a type X2N may be used for the data input/output pin. The type X8 features 4 first input/output pins LDQ and 4 second input/output pins UDQ. The type X36 features 18 first input/output pins LDQ and 18 second input/output pins UDQ. The type X2N features N first input/output pins LDQ and N second input/output pins UDQ.

Figure 3:
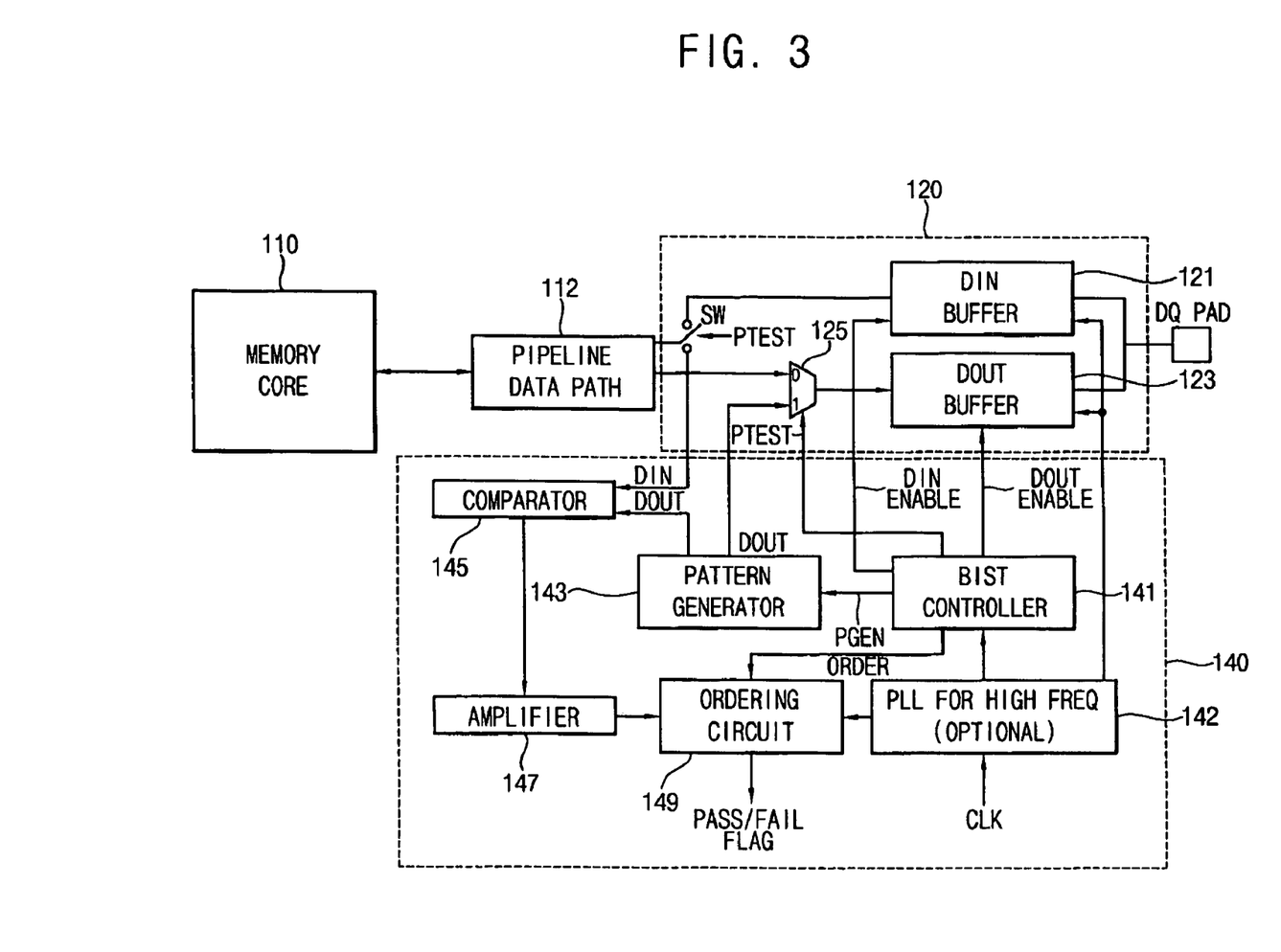
FIG. 3 is block diagram illustrating a memory device including a BIST circuit according to an embodiment.

FIG. 3 is block diagram illustrating a memory device including a BIST circuit according to an example embodiment.

For example, FIG. 3 shows a first buffer circuit 120 and a first BIST circuit 140 coupled to an $i^{th}$ first data input/output pin LDQi. A second buffer circuit 150 and a second BIST circuit 170 may have an identical configuration with that of the first buffer circuit 120 and the first BIST circuit 140.

Referring to FIG. 3, the first buffer circuit 120 (or the second buffer circuit; 150) includes a data input buffer 121, a data output buffer 123, a mode selector 125 and a switch SW.

The first BIST circuit 140 (or the second BIST circuit; 170) includes a BIST controller 141, a test pattern generator 143, a comparator 145, an amplifier 147 and an ordering circuit 149.

The first BIST circuit 140 may optionally include a PLL circuit 142. In particular, while performing a high-speed test operation, the PLL circuit 142 may receive an external clock signal CLK and calibrate a phase error of the received external clock signal CLK. The calibrated clock signal is provided to the BIST controller 141, the data input buffer 121 and the data output buffer 123.

A memory test operation of an example embodiment will be explained below.

The BIST controller 141 of the first BIST circuit 140 or the second BIST circuit 170 generates a test mode signal PTEST, a test pattern generation control signal PGEN, a data input buffer enable signal DIN ENABLE, a data output buffer enable signal DOUT ENABLE, and an ordering control signal ORDER that are used for controlling the memory test operation.

The test pattern generator 143 generates test pattern data when the test mode signal PTEST is activated. The first BIST circuit 140 and the second BIST circuit 150 may generate identical test pattern data.

The mode selector 125 receives the test pattern data output from the test pattern generator 143 to provide the received test pattern data to the data output buffer 123 when the test mode signal PTEST is activated. For example, the mode selector 125 may be implemented using a multiplexer.

The data output buffer 123 outputs the test pattern data output from the mode selector 125 to a first data input/output pin LDQi via a data input/output pad DQ PAD when the data output buffer enable signal DOUT ENABLE provided from the BIST controller 141 is activated.

Data output from the first data input/output pin LDQi are passed through the host 200 and then, the data are input to the second buffer circuit 150. After the data output from the $i^{th}$ first data input/output pin LDQi are passed through the host 200, the data may be input to the second buffer circuit 150 via the $j^{th}$ second data input/output pin UDQj (j may not be equal to i).

Similarly, after the data output from the second data input/output pin UDQi are passed through the host 200, the data may be input to the first buffer circuit 120 via the $j^{th}$ first data input/output pin LDQj (j may not be equal to i).

The test pattern data passed through the host 200 are input to the data input buffer 121 of the second buffer circuit 150 via the input/output data pad DQ PAD. When the test mode signal PTEST is activated, the switch SW is coupled to the comparator 145 included in the second BIST circuit 170. The test pattern data received through the data input buffer 121 as input data DIN are provided to the comparator 145 included in the second BIST circuit 170.

When the test mode signal PTEST is deactivated, the switch SW is coupled to a pipeline data path 112.

Hereinafter, the test pattern data DOUT generated from the first BIST circuit 140 or the second BIST circuit 170 is defined as a first test pattern data, and the test pattern data received through the data input buffer 121 of the first buffer circuit 120 or the second buffer circuit 150 is defined as a received test pattern data.

The comparator 145 compares the first test pattern data with the received test pattern data. For example, the comparator 145 compares the first test pattern data with the received test pattern data bit by bit. The comparator 145 generates a first flag signal PASS when a bit value of the first test pattern data is identical with that of the received test pattern data, and generates a second flag signal FAIL if not.

The amplifier 147 amplifies the first flag signal PASS or the second flag signal FAIL output from the comparator 145 to provide the amplified flag signal to the ordering circuit 149.

The ordering circuit 149 performs an ordering process on the first flag signal or the second flag signal output from the comparator 145 based on the ordering control signal ORDER provided from the BIST controller 141.

When the data are read from the memory cell array (not shown) included in the memory core 110, the test mode signal PTEST is deactivated. The data read from the memory cell array (not shown) are output to the first data input/output pin LDQ or the second first data input/output pin UDQ through the pipeline data path 112, the mode selector 125 and the data output buffer 123.

When the data are written to the memory cell array (not shown) included in the memory core 110, the test mode signal PTEST is deactivated. The data input through the first data input/output pin LDQ or the second data input/output pin UDQ are written to the memory cell array (not shown) through the data input buffer 121 and the pipeline data path 112.

The test pattern data may be output to the host 200 through the multiple first data input/output pins LDQ or the multiple second data input/output pins UDQ. For example, there may be any number of first data input/output pins LDQ or the number of multiple second data input/output pins UDQ.

Figure 4:
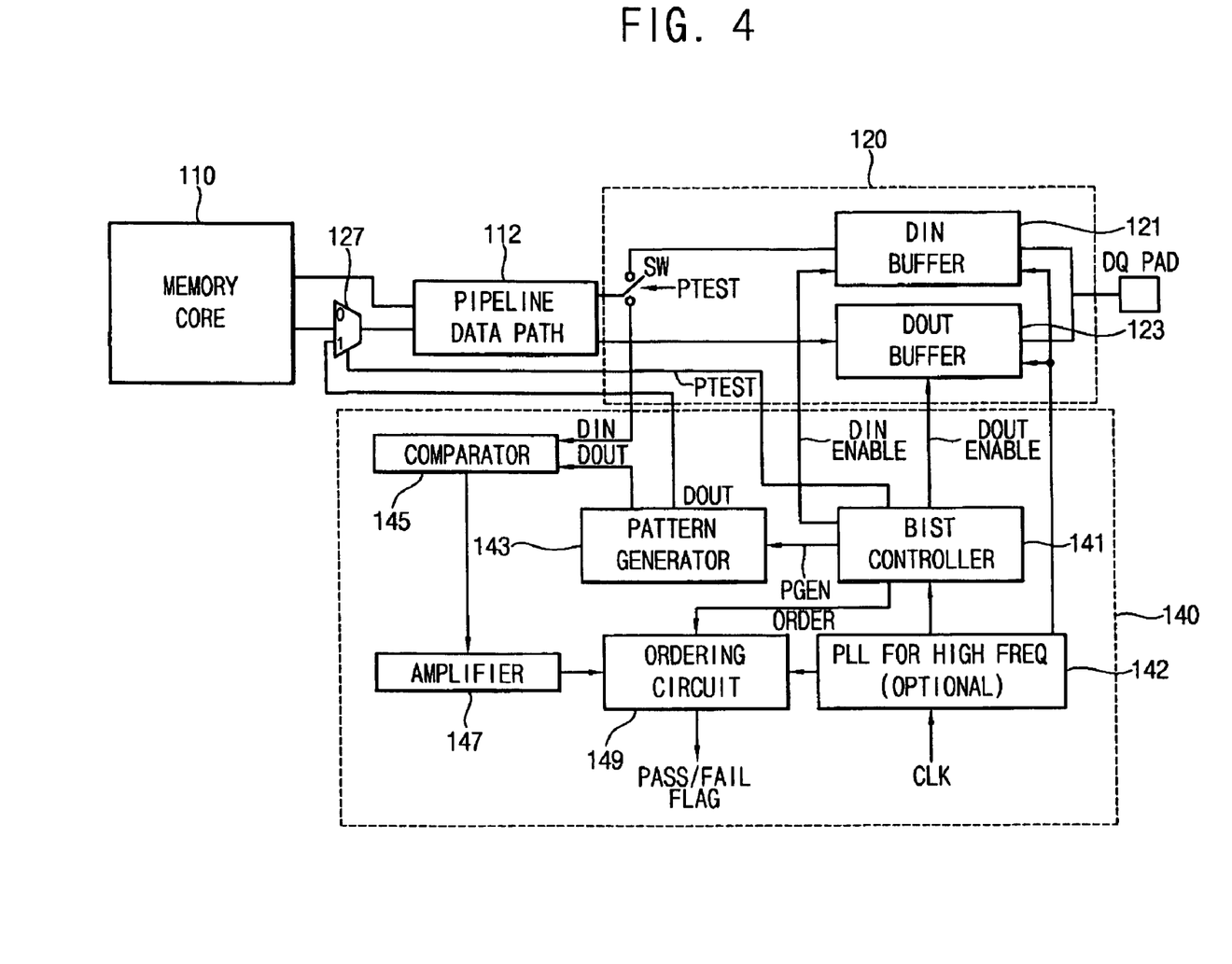
FIG. 4 is block diagram illustrating a memory device including a BIST circuit according to an embodiment.

FIG. 4 is block diagram illustrating a memory device including a BIST circuit according to an embodiment. Unlike the mode selector 125 shown in FIG. 3, the mode selector 127 shown in FIG. 4 is disposed between a memory core 110 and a pipeline data path 112.

Referring to FIG. 4, a BIST controller 141 provides a test mode signal PTEST as a control signal to the mode selector 127. When the test mode signal PTEST is activated, the mode selector 127 receives a first test pattern data from a test pattern generator 143 to provide the first test pattern data to a data output buffer 123 via the pipeline data path 112. For example, the mode selector 127 may be implemented using a multiplexer.

When the data are read from the memory cell array (not shown) included in the memory core 110, the test mode signal PTEST is deactivated. The data read from the memory cell array (not shown) are output to the first data input/output pin LDQ or the second first data input/output pin UDQ through the mode selector 127, the pipeline data path 112 and the data output buffer 123.

When the data are written to the memory cell array (not shown) included in the memory core 110, the test mode signal PTEST is deactivated. The data input through the first data input/output pin LDQ or the second data input/output pin UDQ are written to the memory cell array (not shown) through the data input buffer 121 and the pipeline data path 112.

Figure 5:
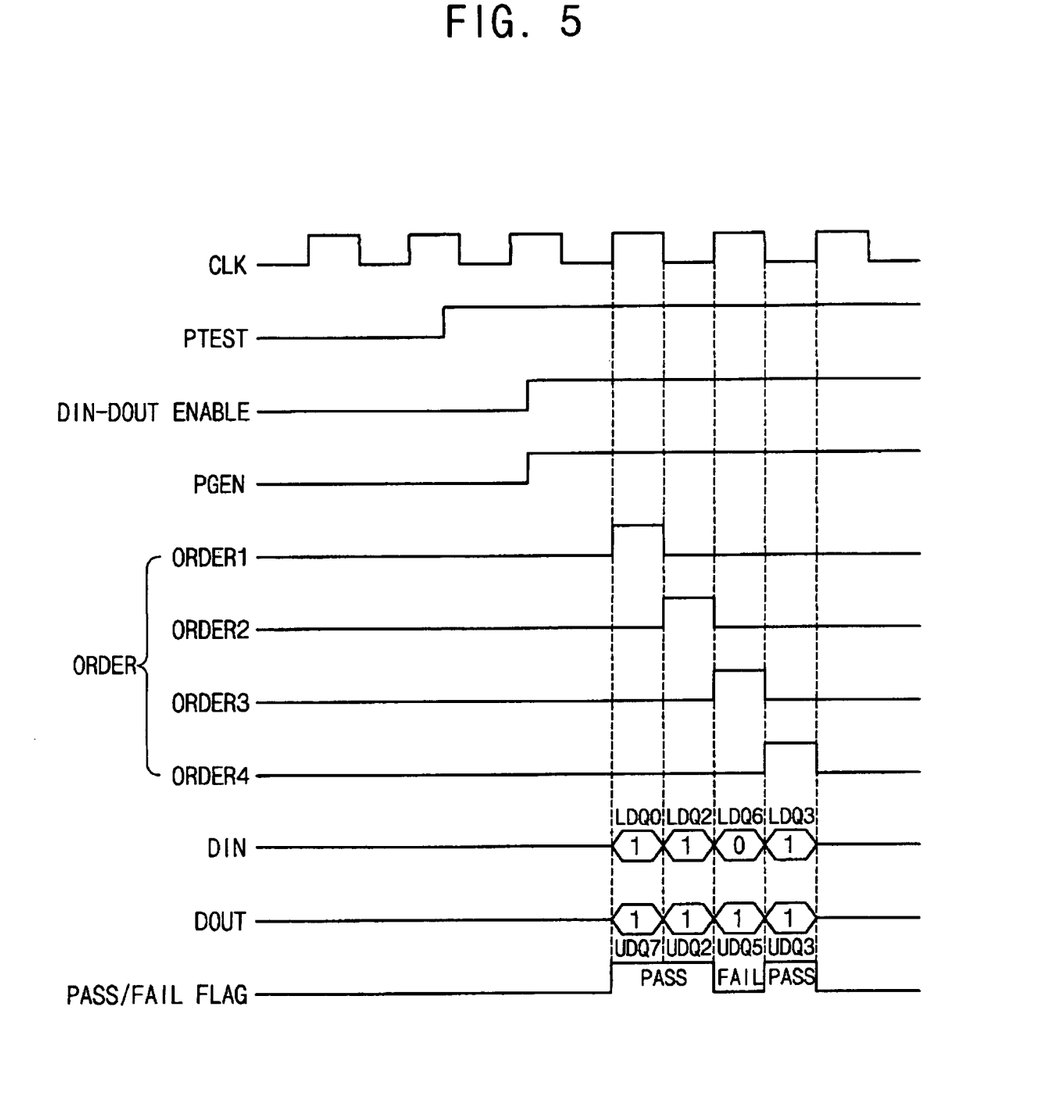
FIG. 5 is a timing diagram for explaining memory test operations according to an embodiment.

FIG. 5 is a timing diagram for explaining memory test operations according to an example embodiment.

Referring to FIG. 5, after the test mode signal PTEST is synchronized to an external clock CLK, a data input buffer enable signal DIN-DOUT ENABLE is activated. While a test pattern generation control signal PGEN is at an active level, a first test pattern data as a DOUT signal are output to a first data input/output pin LDQ through a data output buffer 123.

After the first test pattern data are received through a second data input/output pin UDQ, the received test pattern data as a DIN signal are input to a second BIST circuit 170.

As shown in FIG. 5, the first test pattern data of '1111' are output through the first data input/output pin LDQ0, LDQ2, LDQ6 and LDQ3, and the second test pattern data of '1101' are input through the second data input/output pin UDQ7, UDQ2, UDQ5 and UDQ3.

The first test pattern data may include of N bits (N is a positive integer), and may be sequentially output through a first data input/output pin LDQ, or may be simultaneously output through first data input/output pins LDQ.

The second test pattern data may include M bits (M is a positive integer, and may be sequentially output through a second data input/output pin UDQ, or may be simultaneously output through second data input/output pin UDQ.

The first test pattern data includes N bits may be sequentially output through the single first data input/output pin LDQ. The second test pattern data including M bits may be sequentially output through the single second data input/output pin UDQ.

The second BIST circuit 170 compares the self-generated first test pattern data with the received test pattern data bit by bit. When two bit values of the test pattern data are identical with each other, a first flag signal PASS is output, and when the two bit values of the test pattern data are not identical with each other, a second flag signal FAIL is output.

The flag signals PASS and FAIL are output based on ordering control signals ORDER1 through ORDER4.

In this example, three bit values of the first test pattern data of '1111' and the second test pattern data of '1101' are identical with each other and one bit value of the first test pattern data is not identical with the corresponding bit value of the second test pattern data. As a result, the flag signals PASS, PASS, FAIL, PASS are sequentially output.

As described above with respect to FIG. 5, after the first test pattern data generated from the first BIST circuit 140 are output through the first data input/output pins LDQ, the received test pattern data input to the multiple second data input/output pins UDQ are provided to the second BIST circuit 170. The first test pattern data self-generated in the second BIST circuit 170 is compared with the received test pattern data.

Alternatively, a second test pattern data, generated from the second BIST circuit 170, may be output through the second data input/output pins UDQ. The second test pattern data may be received by the first BIST circuit 140 through the first data input/output pins LDQ as a second received test pattern data.

According to the described semiconductor memory device and the method of testing the same, the BIST circuits may be included at data input/output terminals of the semiconductor memory device. The BIST circuit internally generates test pattern data, executing the memory test.

Therefore, a test time and costs of the memory device with an operating speed as high as several tens GHz may be reduced by executing the memory test according to the embodiments as compared to using an external test device.

The generated test pattern data are output to the host through at least one of the first data input/output pins, and input through at least one of the second data input/output pins. The memory test is executed in the BIST circuit.

A number of the first data input/output pins which output the test pattern data during a memory test may be changed, and the number of the first data input/output pins which receive the test pattern data from the host may also be changed. The memory test may be executed using one or more selected data input/output pins of the memory device.

According to the semiconductor memory device and the method of testing the same, it is possible to reduce test costs and test time by performing a memory test operation inside the semiconductor memory device including a BIST circuit using test pattern data that are self-generated in the semiconductor memory device.

While the example embodiments of the invention and their advantages have been described in detail, it should be understood that various changes, substitutions and alterations may be made herein without departing from the scope of the invention.

What is claimed is:

1. A semiconductor memory device comprising:
   a plurality of pads;
   at least one first built in self test (BIST) circuit configured to generate first test pattern data; and
   at least one second BIST circuit configured to receive the first test pattern data as received first test pattern data and compare the received first test pattern data to second test pattern data;
   wherein:
      each first BIST circuit and each second BIST circuit is coupled to a pad different from a pad coupled to another first BIST circuit or second BIST circuit;
      each first BIST circuit is configured to output the first test pattern data through the pad corresponding to that first BIST circuit; and
      each second BIST circuit is configured to receive the first test pattern data through the pad corresponding to that second BIST circuit; and
   wherein:
      each second BIST circuit is further configured to generate third test pattern data and output the third test pattern data; and
      each first BIST circuit is further configured to receive the third test pattern data as received third test pattern data and compare the received third test pattern data to fourth test pattern data.

2. The semiconductor memory device of claim 1, wherein each second BIST circuit is further configured to generate second test pattern data substantially equivalent to the first test pattern data and compare the received first test pattern data to the second test pattern data.

3. The semiconductor memory device of claim 1, further comprising:
   an ordering circuit configured to generate a flag for each bit of the received first test pattern data, each flag having a first state when a corresponding bit of the received first test pattern data is equivalent to a corresponding bit of the second test pattern data and having a second state when the corresponding bit of the received first test pattern data is not equivalent to the corresponding bit of the second test pattern data.

4. The semiconductor memory device of claim 1, wherein each first BIST circuit is further configured to generate the fourth test pattern data equivalent to the third test pattern data and compare the received third test pattern data to the fourth test pattern data.

5. The semiconductor memory device of claim 1, further comprising:
   an ordering circuit configured to generate a flag for each bit of the received third test pattern data, each flag having a first state when a corresponding bit of the received third test pattern data is equivalent to a corresponding bit of the fourth test pattern data and having a second state when the corresponding bit of the received third test pattern data is not equivalent to the corresponding bit of the fourth test pattern data.

6. The semiconductor memory device of claim 1, wherein each second BIST circuit comprises:
   a comparator;
   a data output buffer configured to output the third test pattern data through the corresponding pad; and
   a data input buffer configured to receive first test pattern data through the corresponding pad and provide the received first test pattern data to the comparator.

7. The semiconductor memory device of claim 1, wherein each second BIST circuit comprises:
   a test pattern generator configured to generate the third test pattern data;
   a data output buffer coupled to the corresponding pad; and
   a mode selector configured to select between data from a memory core and the third test pattern data and provide the selected data from the memory core or third test pattern data to a the data output buffer in response to a test mode signal.

8. The semiconductor memory device of claim 1, wherein the first BIST circuit and the second BIST circuit each further comprise:
   a BIST controller configured to generate a test mode signal and a test pattern generation signal;
   a test pattern generator configured to generate a corresponding test pattern data in response to the test pattern generation signal; and
   a comparator configured to compare the corresponding test pattern data with a corresponding received test pattern data.

9. The semiconductor memory device of claim 1, wherein a number of first BIST circuits is equal to a number of second BIST circuits.

10. A method of testing a semiconductor memory device; comprising:
    generating a first test pattern data in the semiconductor memory device;
    outputting the first test pattern data through a first pad of the semiconductor memory device;
    receiving the first test pattern data through a second pad of the semiconductor memory device;
    generating a second test pattern data substantially equivalent to the first test pattern data output through the first pad of the semiconductor memory device;
    comparing the second test pattern data with the first test pattern data received through the second pad of the semiconductor memory device; and
    switching an output of a data buffer from a pipeline data path to a comparator
    wherein receiving the first test pattern data further comprises receiving the first test pattern data through the data buffer.

11. The method of claim 10, further comprising generating a flag for each bit of the first test pattern data received through the second pad, each flag having a first state when a corresponding bit of the first test pattern data received through the second pad is substantially equivalent to a corresponding bit of the second test pattern data and a second state when the corresponding bit of the first test pattern data received through the second pad is not substantially equivalent to the corresponding bit of the second test pattern data.

12. The method of claim 10, wherein outputting the first test pattern data further comprises outputting the first test pattern data through a second data buffer.

13. The method of claim 12, wherein outputting the first test pattern data further comprises outputting the first test pattern data through a pipeline data path coupled to the second data buffer.

14. The method of claim 10, further comprising:
    receiving an order signal; and outputting a flag in response to the comparison of the first test pattern data received through the second pad and the second test pattern data, and the order signal.

15. A buffer circuit and built in self test (BIST) circuit for a semiconductor memory device comprising:
   a BIST controller configured to generate an enable signal, a test mode signal, and a test pattern generation control signal;
   an output buffer responsive to the enable signal;
   an input buffer responsive to the enable signal;
   a pattern generator configured to generate a test pattern in response to the a test pattern generation control signal;
   a mode selector configured to select between data from a memory core and the test pattern in response to the test mode signal, and provide the selected data or test pattern to the output buffer;
   a comparator;
   a switch configured to switch a received test pattern from the input buffer selectively between the memory core and the comparator;
   an ordering circuit configured to generate a flag in response to the comparison of the test pattern and the received test pattern; and
   a pipeline data path coupled between the output buffer and the memory core;
   wherein the mode selector is coupled between the memory core and the pipeline data path and further configured to provide the selected data or test pattern to the output buffer through the pipeline data path; and
   wherein the comparator is configured to compare the test pattern with a received test pattern.

16. The semiconductor memory device of claim 1, wherein each first BIST circuit comprises:
   a comparator;
   a data output buffer configured to output the first test pattern data through the corresponding pad; and
   a data input buffer configured to receive the third test pattern data through the corresponding pad and provide the received third test pattern data to the comparator.

17. The semiconductor memory device of claim 1, wherein each first BIST circuit comprises:
   a test pattern generator configured to generate the first test pattern data;
   a data output buffer coupled to the corresponding pad; and
   a mode selector configured to select between data from a memory core and the first test pattern data and provide the selected data from the memory core or first test pattern data to the data output buffer in response to a test mode signal.

* * * * *

UNITED STATES PATENT AND TRADEMARK OFFICE
CERTIFICATE OF CORRECTION

| | | |
|---|---|---|
| PATENT NO. | : 7,607,055 B2 | Page 1 of 1 |
| APPLICATION NO. | : 11/349286 | |
| DATED | : October 20, 2009 | |
| INVENTOR(S) | : Dae-Hee Jung et al. | |

It is certified that error appears in the above-identified patent and that said Letters Patent is hereby corrected as shown below:

Column 8, line 31, the word "device;" should read -- device, --.

Signed and Sealed this

Ninth Day of March, 2010

David J. Kappos
*Director of the United States Patent and Trademark Office*